(12) United States Patent
Huang et al.

(10) Patent No.: US 11,844,227 B2
(45) Date of Patent: Dec. 12, 2023

(54) THIN FILM TRANSISTOR AND MANUFACTURING METHOD THEREOF, AND ELECTRONIC DEVICE

(71) Applicants: BOE TECHNOLOGY GROUP CO., LTD., Beijing (CN); PEKING UNIVERSITY, Beijing (CN)

(72) Inventors: Qi Huang, Beijing (CN); Xuelei Liang, Beijing (CN); Hu Meng, Beijing (CN)

(73) Assignees: BOE TECHNOLOGY GROUP CO., LTD., Beijing (CN); PEKING UNIVERSITY, Beijing (CN)

( * ) Notice: Subject to any disclaimer, the term of this patent is extended or adjusted under 35 U.S.C. 154(b) by 305 days.

(21) Appl. No.: 17/269,500

(22) PCT Filed: Jun. 3, 2020

(86) PCT No.: PCT/CN2020/094147
§ 371 (c)(1),
(2) Date: Feb. 18, 2021

(87) PCT Pub. No.: WO2020/244541
PCT Pub. Date: Dec. 10, 2020

(65) Prior Publication Data
US 2021/0328163 A1   Oct. 21, 2021

(30) Foreign Application Priority Data
Jun. 5, 2019 (CN) .......... 201910488469.7

(51) Int. Cl.
*H01L 23/00* (2006.01)
*H10K 10/46* (2023.01)
*H10K 85/20* (2023.01)

(52) U.S. Cl.
CPC ......... *H10K 10/484* (2023.02); *H10K 85/221* (2023.02)

(58) Field of Classification Search
CPC .......................... H10K 10/484; H10K 85/221
See application file for complete search history.

(56) References Cited

U.S. PATENT DOCUMENTS 7,723,223 B2   5/2010 Kim et al.
2007/0102747 A1   5/2007 Chen et al.
(Continued)

FOREIGN PATENT DOCUMENTS

CN   1964074 A   5/2007
CN   103946964 A   7/2014
(Continued)

OTHER PUBLICATIONS

Jia Chen et al. "Self-aligned Carbon Nanotube Transistors with Novel Chemical Doping", IEDM 2004 Conf Proc. 4 pages.
(Continued)

*Primary Examiner* — Anthony Ho

(57) ABSTRACT

A thin film transistor and manufacturing method thereof, an electronic device are provided, which includes: a gate electrode, a gate insulation layer, an active layer, a first electrode and a second electrode are on a base substrate, the active layer made of a one-dimensional semiconductor nano material includes a first electrode region, a second electrode region, a first channel region, a second channel region; the first electrode region and the second electrode region are in contact with the first electrode and the second electrode respectively, the first channel region is directly connected with the first channel region and the second channel region respectively, the second channel region is a first doped region and between the first electrode region and the second electrode region; an energy level of the second channel region is different from that of the first channel region corresponding to the energy level of the second channel region.

18 Claims, 6 Drawing Sheets

(56) References Cited

U.S. PATENT DOCUMENTS

| | | |
|---|---|---|
| 2013/0134392 A1 | 5/2013 | Afzali-Ardakani et al. |
| 2015/0311457 A1 | 10/2015 | Cao et al. |
| 2015/0311458 A1 | 10/2015 | Jin et al. |
| 2016/0043207 A1 | 2/2016 | Kim et al. |

FOREIGN PATENT DOCUMENTS

| | | |
|---|---|---|
| CN | 105097939 A | 11/2015 |
| CN | 105810587 A | 7/2016 |
| CN | 106816473 A | 6/2017 |
| CN | 109560044 A | 4/2019 |
| CN | 110137356 A | 8/2019 |
| KR | 101410933 B1 | 6/2014 |

OTHER PUBLICATIONS

Yu-Ming Lin, et al; "Ambipolar-to-Unipolar Conversion of Carbon Nanotube Transistors by Gate Structure Engineering", Nano Letters, vol. 4, No. 5 pp. 947-950; Published on Web Mar. 31, 2004.
The First Chinese Office Action dated Jan. 27, 2021; Appln. No. 201910488469.7.

THIN FILM TRANSISTOR AND MANUFACTURING METHOD THEREOF, AND ELECTRONIC DEVICE

The present application claims priority of Chinese Patent Application No. 201910488469.7 filed on Jun. 5, 2019, the disclosure of which is incorporated herein by reference in its entirety as part of the present disclosure.

TECHNICAL FIELD

Embodiments of the present disclosure relate to a thin film transistor and a manufacturing method of the thin film transistor, and an electronic device.

BACKGROUND

Thin film transistors (TFTs) are important components of some electronic devices. For example, the thin film transistors are switching elements of pixel circuits in active display devices. Active layers which are important structures in the thin film transistors are made of semiconductor materials, and the active layers can generate carriers for conduction under the control of gate electrodes. In recent years, one-dimensional semiconductor nano materials have been used in the thin film transistors due to their excellent electrical properties.

SUMMARY

Embodiments of the present disclosure provide a thin film transistor, and the thin film transistor comprises: a base substrate, and a gate electrode, a gate insulation layer, an active layer, a first electrode and a second electrode which are arranged on the base substrate, in which a material of the active layer is a one-dimensional semiconductor nano material, and the active layer comprises a first electrode region, a second electrode region, a first channel region, and a second channel region; the first electrode region and the second electrode region are in contact with the first electrode and the second electrode respectively, the first channel region is directly connected with the first channel region and the second channel region respectively, and the second channel region is located between the first electrode region and the second electrode region; the second channel region is a first doped region, and an energy level of the second channel region is different from an energy level of the first channel region corresponding to the energy level of the second channel region.

In some examples, a doping concentration of the second channel region is higher than a doping concentration of the first channel region.

In some examples, the material of the active layer comprises a carbon nanotube material or a nanowire material.

In some examples, the thin film transistor is a p-type thin film transistor, and the energy level of the second channel region is higher than the energy level of the first channel region corresponding to the energy level of the second channel region; or the thin film transistor is an n-type thin film transistor, and the energy level of the second channel region is lower than the energy level of the first channel region corresponding to the energy level of the second channel region.

In some examples, the thin film transistor is the p-type thin film transistor, a material of the first channel region is carbon nanotube, and a material of the second channel region is p-type carbon nanotube material obtained by doping the carbon nanotube with triethyloxonium hexachloroantimonate (OA) or yttrium oxide.

In some examples, the gate electrode is farther away from the base substrate than the active layer; and a gap exists between the gate electrode and the second electrode, and in a direction perpendicular to the base substrate, the gap exposes the second channel region of the active layer.

In some examples, in a direction perpendicular to the base substrate, the gate electrode overlaps with the first channel region and does not overlap with the second channel region.

In some examples, in a direction perpendicular to the base substrate, the gate electrode overlaps with the first electrode and does not overlap with the second electrode.

In some examples, in a direction perpendicular to the base substrate, the gate insulation layer overlaps with the first channel region and does not overlap with the second channel region.

In some examples, in a direction perpendicular to the base substrate, the gate electrode overlaps with both the first channel region and the second channel region.

In some examples, the first electrode region and the second electrode region are second doped regions respectively, and both a doping concentration of the first electrode region and a doping concentration of the second electrode region are higher than a doping concentration of the second channel region.

In some examples, the first electrode and the second electrode are a source electrode of the thin film transistor and a drain electrode of the thin film transistor, respectively.

Embodiments of the present disclosure further provide an electronic device, and the electronic device comprises any one of the thin film transistors mentioned above.

Embodiments of the present disclosure further provide a manufacturing method of a thin film transistor, and the manufacturing method comprises: forming an active layer, a first electrode, a second electrode, a gate insulation layer, and a gate electrode on a base substrate, in which the forming the active layer comprises: forming a one-dimensional semiconductor nano material layer, the one-dimensional semiconductor nano material layer comprises a first electrode region, a second electrode region, a first channel region, and a first region to be doped, the first electrode and the second electrode are in contact with the first electrode region and the second electrode region respectively, the first channel region is directly connected with both the first electrode region and the first region to be doped, and the first region to be doped is located between the first channel region and the second electrode region; and doping the first region to be doped to form a second channel region, in which an energy level of the second channel region is different from an energy level of the first channel region corresponding to the energy level of the second channel region.

In some examples, a material of the active layer comprises a carbon nanotube material or a nanowire material.

In some examples, the forming the active layer, the first electrode, the second electrode, the gate insulation layer, and the gate electrode on the base substrate comprises: forming the active layer on the base substrate, forming the gate insulation layer on the active layer, forming the gate electrode on the gate insulation layer, in which in a direction perpendicular to the base substrate, the gate electrode overlaps with the first electrode, and a gap exists between the gate electrode and the second electrode, and the gap exposes the first region to be doped.

In some examples, the material of the active layer comprises the carbon nanotube material, and the doping the first region to be doped to form the second channel region comprises: after forming the gate electrode, doping the first region to be doped with triethyloxonium hexachloroantimonate (OA).

In some examples, the manufacturing method further comprises: after forming the gate electrode and before doping the first region to be doped, forming a protective layer to cover the thin film transistor, in which the protective layer exposes the first region to be doped.

In some examples, the forming of the active layer further comprises: removing a portion of the one-dimensional semiconductor nanomaterial layer extending beyond the first electrode and the second electrode.

BRIEF DESCRIPTION OF THE DRAWINGS

In order to clearly illustrate the technical solution of the embodiments of the present disclosure, the drawings of the embodiments will be briefly described in the following. It is obvious that the described drawings in the following are only related to some embodiments of the present disclosure and thus are not limitative of the present disclosure.

DETAILED DESCRIPTION

Figure 1A:
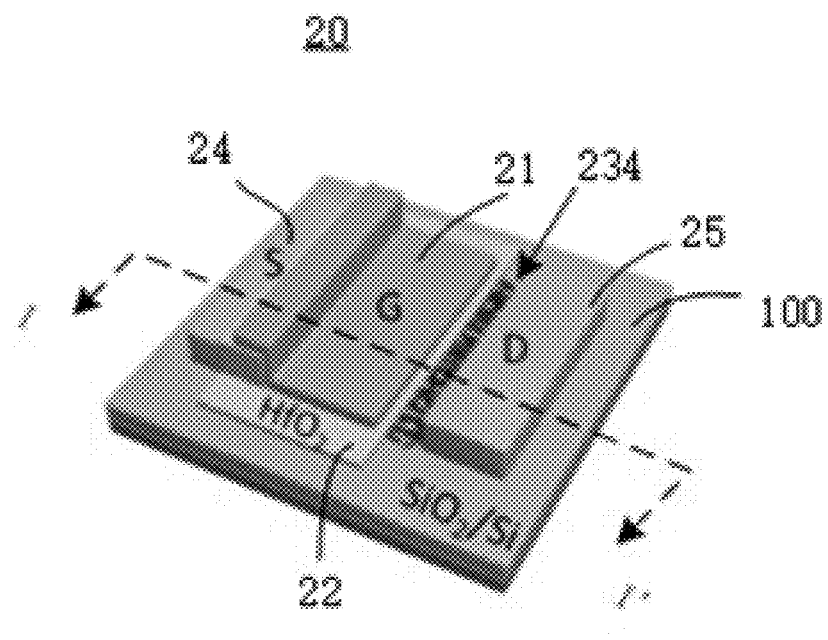
FIG. 1A is a schematic diagram of a thin film transistor provided in some embodiments of the present disclosure.

In order to make objectives, technical details and advantages of the embodiments of the present disclosure apparent, the technical solutions of the embodiments will be described in a clearly and fully understandable way in connection with the drawings related to the embodiments of the present disclosure. Apparently, the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "left", "right" and the like are only used to indicate relative position relationship, and when the position of the described object is changed, the relative position relationship may be changed accordingly.

A one-dimensional semiconductor nano material refers to a semiconductor material with a nanometer scale (for example, 0.1 nm to 100 nm) in two dimensions other than a length direction. The one-dimensional semiconductor nano material includes, for example, carbon nanotubes and nanowires and so on. The one-dimensional semiconductor nano material has many advantages, such as, high mobility, mechanical flexibility, optical transparency, and so on. Therefore, it is believed that the one-dimensional semiconductor nano material can be used to fabricate high-performance microelectronic devices, such as, field effect transistors based on the one-dimensional semiconductor nano material, and 4-bit adders, display driving circuits, compatible flexible circuits and sensors and so on using the field effect transistors. The field effect transistors are, for example, insulated gate field effect transistors (MOSFETs), such as, thin film transistors and so on.

For example, for a large-scale integrated circuit, in high-speed and low-power applications, a transistor needs to have a high current switching ratio and a low turn-off state current. However, due to a small band gap of a carbon nanotube, in a turn-off state, a potential barrier between the carbon nanotube at a drain terminal of the transistor and the metal electrode becomes thinner so that a phenomenon of electron tunneling is easily to occur. For example, a micron-sized carbon nano thin film transistor has usually a turn-off state current of higher than 100 nanoamps and tends to have bipolar property, while a switching ratio at high bias voltage (1V) also decays to below 102. Such phenomenon becomes more obvious when using high-k and relatively thin gate dielectric. Based on the percolation theory, the turn-off state current of a carbon nanotube thin film transistor depends on a channel length, and in the case where the channel length is less than several microns, the turn-off state current is more difficult to suppress.

Some researchers have manufactured the carbon nanotube thin film transistors with a high switching ratio. However, in their work, the carbon nanotube thin film transistors usually tend to have relatively large size (more than 100 microns), or a very small source drain bias voltage (0.1V), and thus these devices are not suitable for use in an actual circuit. Therefore, there is a need for improving the performance of the carbon nanotube thin film transistor, and suppressing the bipolar property and reducing the turn-off state current in an effective mode.

Although some research groups have achieved an effect of suppressing the bipolar property on single-walled carbon nanotube field-effect transistors by means of double gate structure, feedback gate structure and chemical doping and so on respectively, these methods involve complicated manufacture processes and will reduce the on-state current of a device.

Embodiments of the present disclosure provide a field effect transistor in which a one-dimensional semiconductor nano material is used to manufacture an active layer. The energy level of the one-dimensional semiconductor nano material is regulated by asymmetrically doping the active layer so that the performance of the field effect transistor is successfully improved. Hereinafter the embodiments of the present disclosure will be illustrated by examples of a one-dimensional semiconductor nano material as the carbon nanotube material and a field effect transistor as the thin film transistor.

It should be noted that the source electrode and the drain electrode of the thin film transistor adopted herein can be symmetrical in structure, and thus there is no structural difference between the source electrode and the drain electrode. In the embodiments of the present disclosure, in order to distinguish the two electrodes of the transistor other than the gate electrode, one electrode is directly described as the first electrode, and the other electrode is described as the second electrode.

Figure 1B:
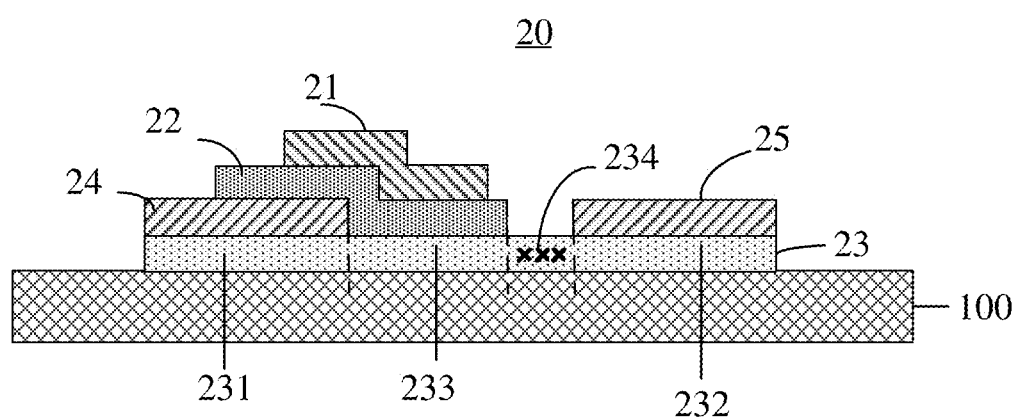
FIG. 1B is a sectional view of FIG. 1A taken along section line I-I'.

FIG. 1A is a perspective view of a thin film transistor provided in some embodiments of the present disclosure, and FIG. 1B is a sectional view of FIG. 1A taken along section line I-I'. Referring to FIG. 1A and FIG. 1B, the thin film transistor 20 includes a base substrate 100, and a gate electrode 21, a gate insulation layer 22, an active layer 23, a first electrode 24, and a second electrode 25 arranged on the base substrate 100. The material of the active layer is a carbon nanotube material (such as, a single-walled carbon nanotube material or a double-walled carbon nanotube material), which has semiconductor property. Different regions of the active layer can have different conductive characteristics by doping the carbon nanotube material with different concentrations. The active layer 23 includes a first electrode region 231, a second electrode region 232, a first channel region 233, and a second channel region 234. The second channel region 234 is a doped region, and an energy level of the second channel region 234 is different from an energy level of the first channel region 233 corresponding to the energy level of the second channel region 234. As used herein, the "corresponding to the energy level" refers to the energy level with the same name, for example, the corresponding energy level can be a bottom of conduction band or a top of valence band. For example, the bottom of conduction band Ec2 of the second channel region 234 is different from the bottom of conduction band Ec1 of the first channel region 233. The top of valence band Ev2 of the second channel region 234 is different from the top of valence band Ev1 of the first channel region 233. The difference between the corresponding energy levels of the second channel region 234 and the first channel region 233 may be caused by, for example, the difference in doping concentrations. For example, the first electrode region 231, the second electrode region 232, the first channel region 233, and the second channel region 234 are in an integrated structure.

It should be noted that the "integrated structure" in the present disclosure refers to a structure in which two (or more) structures are formed in the same deposition process and patterned in the same patterning process so that they are inter-connected with each other, and the materials of the two (or more) structures can be the same or different. For example, the main materials of the first electrode region 231, the second electrode region 232, the first channel region 233, and the second channel region 234 can be the same, i.e., all of them can be carbon nanotube materials, which can have different conductive characteristics due to different doping concentrations.

The first electrode region 231 and the second electrode region 232 are in contact with the first electrode 24 and the second electrode 25, respectively. For example, the first electrode region 231 and the second electrode region 232 form ohmic contact with the first electrode 24 and the second electrode 25, respectively. As shown in FIG. 1B, an orthographic projection of the first electrode region 231 on the base substrate 100 is within an orthographic projection of the first electrode 24 on the base substrate 100, and an orthographic projection of the second electrode region 232 on the base substrate 100 is within an orthographic projection of the second electrode 25 on the base substrate 100. The first channel region 233 is located between the first electrode region 231 and the second channel region 234, and the first channel region 233 is directly connected with the first electrode region 231 and the second channel region 234, respectively. As shown in FIG. 1B, the first channel region 233 is exposed between the first electrode 24 and the second electrodes 25, that is, an orthographic projection of the first channel region 233 on the base substrate 100 is outside both the orthographic projection of the first electrode 24 on the base substrate 100 and the orthographic projection of the second electrode 25 on the base substrate 100. The second channel region 234 is located between the first channel region 233 and the second electrode region 232, for example, the second channel region 234 is directly connected with the first channel region 233 and the second electrode region 232. A doping concentration of the second channel region 234 is higher than a doping concentration of the first channel region 233, that is, the active layer provided in the embodiments of the present disclosure is an asymmetrically doping structure. For example, the second channel region 234 is a doped region and the first channel region 233 is an un-doped region. For example, as shown in FIG. 1B, the second channel region 234 is exposed between the first electrode 24 and the second electrodes 25, that is, an orthographic projection of the second channel region 234 on the base substrate 100 is outside the orthographic projection of the first electrode 24 on the base substrate 100 and the orthographic projection of the second electrode 25 on the base substrate 100.

For example, as shown in FIG. 1B, in a direction perpendicular to the base substrate 100, the gate electrode 21 overlaps with the first channel region 233, and the gate electrode 21 does not overlap with the second channel region 234. For example, the first channel region 233 is a main channel region under the control of the gate electrode of the thin film transistor 20. For example, a channel length of the first channel region 233 is greater than a channel length of the second channel region 234. By arranging the gate electrode to be non-overlapping with the second channel region, the influence of gate voltage on the energy level of the second channel region can be avoided, and the bipolar property of the device can be further suppressed and the turn-off state current can be reduced, which will be explained in details below.

The second channel region 234 is, for example, a p-type doped region or an n-type doped region. By arranging the second channel region as a doped region, it is feasible to regulate the relationship between the energy levels of the second channel region 234 and the first channel region 233, and in turn achieve the adjustment of the electrical characteristics of the thin film transistor.

For example, as shown in FIG. 1B, in the direction perpendicular to the base substrate 100, the gate insulation layer 22 overlaps with the first channel region 233, and does not overlap with the second channel region 234. Such arrangement helps to selectively dope the second channel region 234. This will be described in details below when introducing the manufacturing process.

Figure 2A:
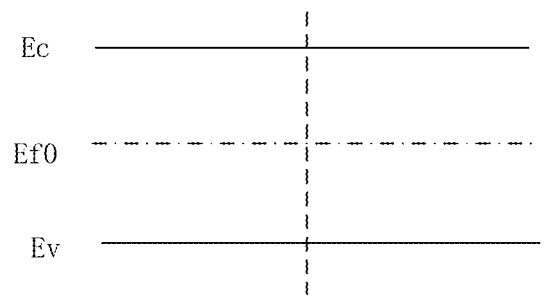
FIG. 2A to FIG. 2C show schematic diagrams of energy level regulation of a first channel region and a second channel region by doping.
Figure 2B:
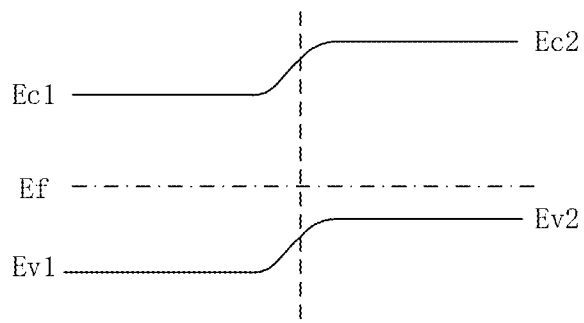
Figure 2C:
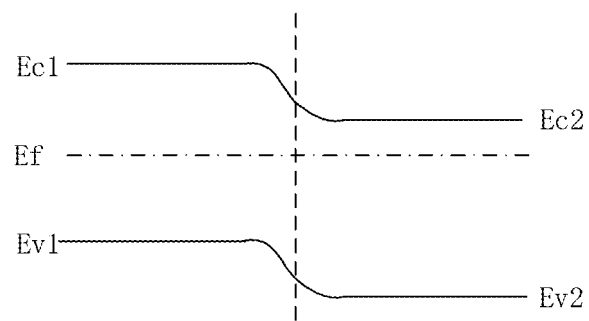

FIG. 2A to FIG. 2C show schematic diagrams of the regulation of energy levels of a first channel region and a second channel region by doping. FIG. 2A shows the energy level diagrams of the first channel region and the second channel region before doping, and FIG. 2B and FIG. 2C show the energy level diagrams of the first channel region and the energy level of the second channel region after p-type doping and n-type doping, respectively. As shown in FIG. 2A, before doping, the corresponding energy levels of the first channel region 233 and the second channel region 234 are the same because the material of the first channel region 233 is the same as the material of the second channel region 234.

As shown in FIG. 2B, after the second channel region 234 is p-doped, because the first channel region 233 is in direct contact with the second channel region 234, holes in the second channel region 234 diffuse into the first channel region 233, so that the second channel region 234 and the first channel region 233 reach a thermal equilibrium, that is, a unified Fermi level Ef is achieved. The movement of the charge causes the potential of the second channel region 234 to decrease and the potential of the first channel region 233 to increase, so that the energy level of the second channel region 234 moves up integrally relative to the first channel region 233, and a space charge region is formed close to a contact region between the first channel region 233 and the second channel region 234, thereby forming an energy level diagram as shown in FIG. 2B. In the space charge region, the energy band bends, which is the result of the potential charge in the space charge region. Because of the bending of the energy band, electrons need to overcome this potential barrier while moving from the first channel region 233 with low potential energy to the second channel region 234 with high potential energy. Similarly, holes need to overcome the potential barrier to reach the first channel region 233 from the second channel region 234. As shown in FIG. 2B, the energy level of the second channel region 234 is different from the corresponding energy level of the first channel region 233, respectively, and the bottom of conduction band Ec2 and the top of valence band Ev2 of the second channel region 234 are higher than the bottom of conduction band Ec1 and the top valence band Ev1 of the first channel region 233, respectively.

The principle of energy level change in FIG. 2C is similar, and is not repeated here. As shown in FIG. 2C, after the second channel region 234 is n-doped, the bottom of conduction band Ec2 and the top of valence band Ev2 of the second channel region 234 are lower than the bottom of conduction band Ec1 and the top of valence band Ev1 of the first channel region 233, respectively.

For example, the first channel region 233 is an intrinsic carbon nanotube semiconductor material, and the second channel region 234 is an n-type semiconductor material or a p-type semiconductor material obtained by doping the intrinsic carbon nanotube semiconductor material.

For example, the carbon nanotube material adopted in the embodiment of the present disclosure is a carbon nanotube material with semiconductor characteristics and having a chiral index (n, m) satisfying that (n−m)/3 is a non-integer. However, the embodiments of the present disclosure are not limited to specific chiral carbon nanotubes.

The material of the second channel region 234 is, for example, a p-type carbon nanotube material obtained by doping carbon nanotubes with triethyloxonium hexachloroantimonate $(C_2H_5)_3O^+SbCl_6^-$ (OA). OA molecules which have certain oxidizability can be adsorbed onto the surface of the carbon nanotubes, and charge transfer occurs between the OA molecules and the carbon nanotubes to enable the carbon nanotubes to be stably positively charged, thereby achieving the p-type doping.

In other examples, the material of the second channel region 234 can also be a p-type carbon nanotube material obtained by doping carbon nanotubes with yttrium oxide. For example, the active layer can be p-doped by forming an yttrium oxide layer above the active layer corresponding to the second channel region 234 to obtain the second channel region 234 which is p-type.

In other examples, the material of the second channel region 234 can also be an n-type carbon nanotube material obtained by doping carbon nanotubes with alumina. For example, the active layer can be n-doped by forming an alumina layer above the active layer corresponding to the second channel region 234 so as to obtain the second channel region 234 which is n-type.

For example, the base substrate 100 is a flexible substrate, and the material of the base substrate 100 can be polyimide (PI), polycarbonate (PC), polyethylene glycol terephthalate (PET), polyethylene (PE), polypropylene (PP), polysulfone (PSF), polymethylmethacrylate (PMMA), cellulose triacetate (TAC), cycloolefin polymer (COP), and cycloolefin copolymer (COC) and so on. The base substrate 100 may also be a hard substrate, such as, a glass substrate, a silicon-based substrate and so on.

As shown in FIG. 1A, in order to prevent the silicon substrate from affecting the characteristics of the device, a silicon oxide film can also be formed on the silicon substrate as a buffer layer.

For example, as shown in FIG. 1A and FIG. 1B, the thin film transistor 100 has a top gate structure, that is, the gate electrode 21 is farther away from the base substrate 100 than the active layer 23. However, the embodiments of the present disclosure do not limit the structure type of the thin film transistor 100, and in other examples, the thin film transistor 100 may also have a bottom gate structure or other structures.

For example, the gate electrode 21 overlaps with the first electrode 24 in the direction perpendicular to the base substrate 100, that is, an orthographic projection of the gate electrode 21 on the base substrate 100 overlaps with an orthographic projection of the first electrode 24 on the base substrate 100 so that the portion of the first channel region 233 close to the first electrode 24 under the control of the gate electrode, thereby help to improve the turn-on state current.

For example, the gate electrode 21 and the second electrode 25 are spaced apart from each other, and a gap exists between the gate electrode 21 and the second electrode 25 in the direction perpendicular to the base substrate 100, that is, a gap (that is, non-overlapping) exists between the orthographic projection of the gate electrode 21 on the base substrate 100 and the orthographic projection of the second electrode 25 on the base substrate 100. The gap exposes the second channel region 234 of the active layer 23.

For example, as shown in FIG. 1B, the gate insulation layer 22 and the second electrode 25 are also spaced apart from each other, and a gap exists between the gate insulation layer 22 and the second electrode 25 in the direction perpendicular to the base substrate 100. The gap also exposes the second channel region 234.

In this structure, the gate electrode 21 and the gate insulation layer 22 are asymmetric with respect to the first electrode 21 and the second electrode 22, which corresponds to the manufacturing process of the device. However, the embodiments of the present disclosure are not limited to this.

Figure 3A:
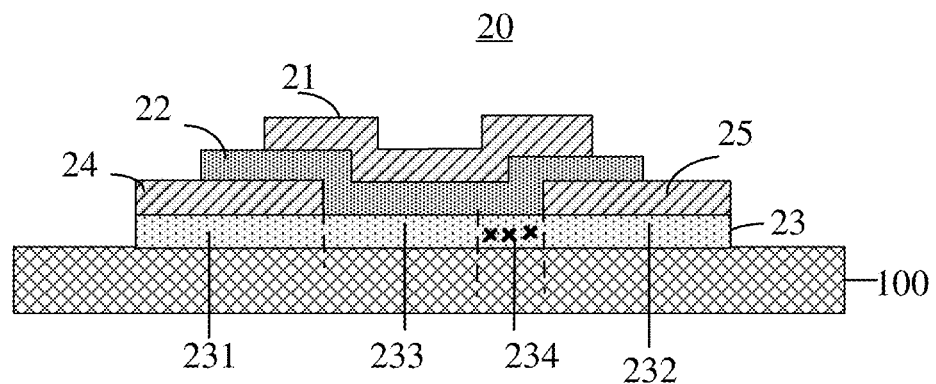
FIG. 3A is a schematic diagram of a thin film transistor provided in other embodiments of the present disclosure.

In other examples, as shown in FIG. 3A, the gate electrode 21 and the gate insulation layer 22 may also be symmetrical with respect to the first electrode 24 and the second electrode 25. In the direction perpendicular to the base substrate 100, the gate electrode 21 overlaps with the second electrode 25. In this case, the second channel region 234 is also under the control of the gate electrode 21, which can further increase the turn-on state current.

For example, both the first electrode 24 and the second electrode 25 are located at the side of the active layer 23 away from the base substrate 100, that is, both the first electrode 24 and the second electrode 25 are located between the active layer 23 and the gate insulation layer 22 so that the active layer 23 is formed on a relatively flat surface, thereby reducing the defect state of the active layer 23.

For example, the first electrode 24 and the second electrode 25 are the source electrode and the drain electrode of the thin film transistor 20, respectively. Accordingly, the first electrode region 231 and the second electrode region 232 are a source contact region and a drain contact region, respectively. That is, the second channel region is arranged between the first channel region and the drain contact region, and the drain electrode refers to the electrode into which majority carriers of the device flow from the channel region and is distinguished from the source electrode from which most carriers flow out. The majority carriers refer to the main charges forming the turn-on state current of the transistor. For example, for the n-type transistor, the majority carriers are electrons. For the p-type transistor, the majority carriers are holes. Because the turn-off state current is formed by the reverse tunneling of minority carriers from the drain electrode to the channel region, by arranging the doped second channel region 234 between the first channel region 233 and the drain contact region, a potential barrier can be formed between the second channel region and the drain electrode to effectively prevent minority carriers from tunneling to form a leakage current, thereby reducing the turn-off state leakage current. For example, in the case where the thin film transistor 20 is applied into a circuit, the second electrode 25 can be connected as a drain electrode.

In addition, compared with the thin film transistor based on the symmetrically doped active layer (for example, the channel region with uniform doping concentration), the thin film transistor provided in the embodiments of the disclosure can further improve the turn-on state current, which will be described in details with reference to FIG. 4 below.

Figure 4:
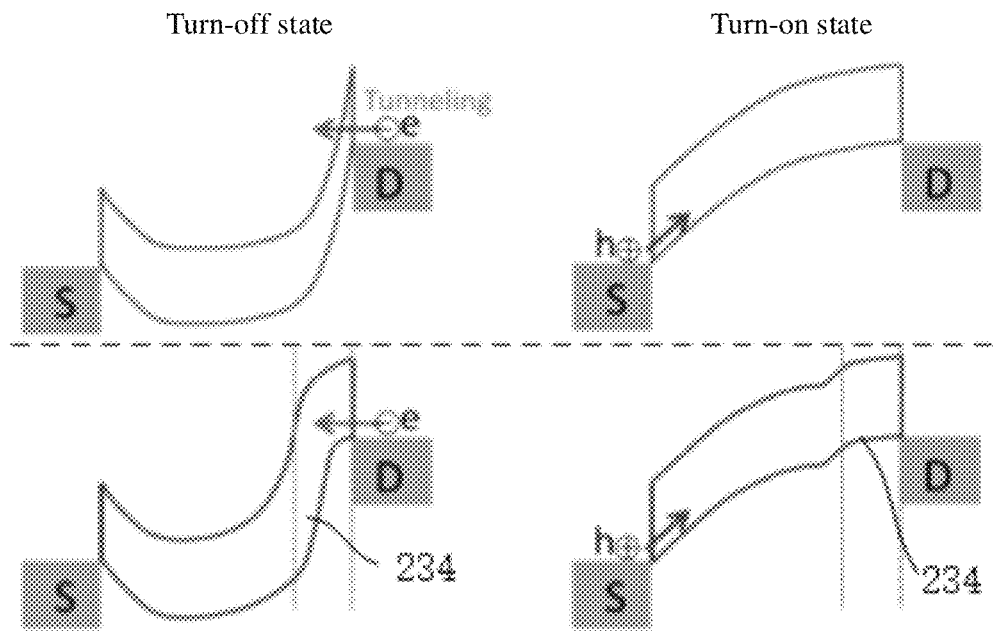
FIG. 4 shows a schematic diagram of energy band of the thin film transistor before and after doping a second channel region.

FIG. 4 shows a schematic diagram of energy band of the active layer of the thin film transistor in a turn-off state and a turn-on state, respectively, when the second channel region of the thin film transistor is un-doped and p-doped. The energy bands of the active layers of the undoped thin film transistors correspond to the panel above the dotted line, and the energy bands of the active layers of the doped thin film transistors correspond to the panel below the dotted line. Because the turn-on state current is mainly contributed by majority carriers (holes) and the turn-off state current is mainly contributed by minority carriers (electrons), the turn-on state and the turn-off state will be accordingly analyzed as follows. In the example, e.g., the first channel region is undoped; in other examples, both the first channel region and the second channel region can be doped regions, and the doping concentration of the second channel region is higher than the doping concentration of the first channel region.

In the turn-off state, a positive voltage is applied to the gate electrode of the thin film transistor, and there is an electric field with the first electrode (the source electrode S) pointing to the second electrode (the drain electrode D). Close to the drain electrode, under the action of the gate piezoelectric field, the energy level shifts downward, while under the action of the drain electric field, the energy level shifts upward. For the un-doped second channel region 234, it makes the Schottky barrier between the second channel region 234 and the second electrode 25 thinner, which makes the minority carriers (electrons) easy to tunnel, resulting in a large turn-off state current, or even the occurring of bipolar property. In the case that the second channel region is p-doped, as shown in FIG. 2B, because the energy band bending occurs in the space charge region, the Schottky barrier becomes very thick, thereby suppressing the tunneling of the minority carriers, reducing the turn-off state leakage current, and suppressing the bipolarity of the device.

Figure 3B:
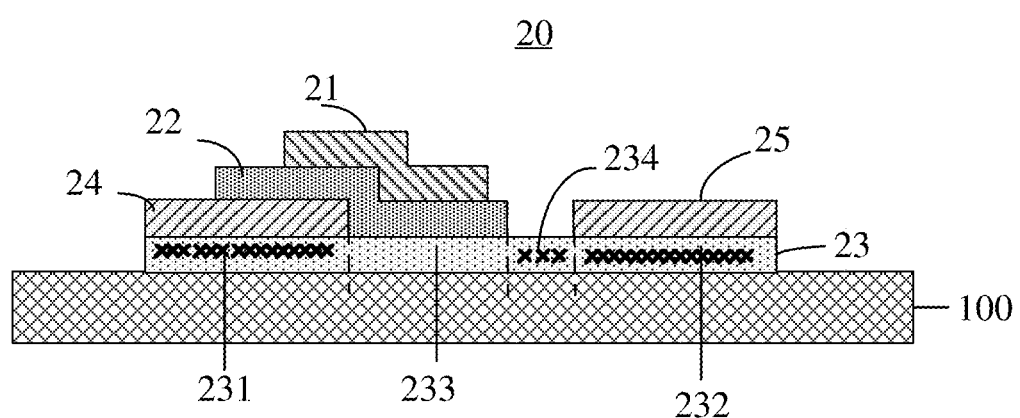
FIG. 3B is a schematic diagram of a thin film transistor provided in still other embodiments of the present disclosure.

For example, referring to FIG. 1B and FIG. 3B, because the gate electrode only overlaps with the first channel region, the second channel region 234 is less controlled by the gate electrode as compared with the first channel region 233, which can reduce the downward shift of energy level, further prevent the formation of a thin reverse tunneling barrier and weaken the reverse tunneling current, thereby reducing the turn-off state current and preventing occurring of the bipolar property.

In other examples, both the first channel region and the second channel region are doped regions, and the doping concentration of the second channel region is higher than the doping concentration of the first channel region. In the case where both the first channel region and the second channel region are controlled by a common gate voltage, for example, the gate electrode covers both the first channel region and the second channel region, the high doping concentration of the first channel region will lead to excessive conducting gate voltage, which will lead to excessive downward shift of the energy level of the first channel region, and make the Schottky barrier between the second channel region and the second electrode thinner, thereby making the minority carriers (electrons) easy to tunnel, resulting in a large turn-off state current, or even the occurring of device bipolarity. By setting the doping concentration of the second channel region to be higher than the doping concentration of the first channel region, the influence of the gate voltage on the Schottky barrier between the second channel region and the second electrode can be effectively avoided.

In the turn-on state, for the majority carriers (holes), doping causes the Schottky barrier between the second channel region 234 and the second electrode 25 to be decreased, thereby increasing the turn-on state current.

It can be similarly understood that, in the case where the active layer is symmetrically doped, for example, the active layer has channel regions with uniform doping concentration, because the first channel region 233 is doped in the region adjacent to the first electrode 24, the Schottky barrier between the first electrode 24 and the first channel region 233 increases, thereby reducing the turn-on state current. Therefore, the active layer structure with the asymmetrically doping provided in the embodiments of the present disclosure can increase the turn-on state current, while suppressing the turn-off state leakage current, thereby further improving the current switching ratio.

Similarly, the performance of the thin film transistor can also be improved by n-doping of the second channel region 234, which is not repeated in details herein. For example, carbon nanotubes can be n-doped with alumina. For example, the second channel region 234 can be n-doped by covering the second channel region 234 with an alumina layer.

For example, both the first electrode 24 and the second electrode 25 are made of a metal material or a metal alloy material. Because of the one-dimensional characteristics of the carbon nanotubes, there is no Fermi surface pinning effect in the case where the metal is in contact with semiconductor carbon nanotubes, so that a height of the Schottky barrier formed by contacting the first electrode 24 with the second electrode 25 is mainly determined by the work function difference between the carbon nanotubes and the metal material.

For example, the Fermi level of the metal is close to the bottom of conduction band of the carbon nanotubes or the top of valence band of the carbon nanotubes, and the difference between the Fermi level and the bottom of conduction band or between the Fermi level and the top of valence band, for example, is not more than 0.3 eV. For example, for an n-type thin film transistor, that is, in the case where the second channel region 234 is an n-doped region, the Fermi level of the metal is close to the bottom of conduction band of the carbon nanotubes, which is conducive to the smooth injection of electrons in the metal into the carbon nanotubes.

For example, for a p-type thin film transistor, that is, in the case where the second channel region 234 is a p-doped region, the Fermi level of the metal is close to the top of valence band of the carbon nanotubes, which is conducive to the smooth injection of holes in the metal into the carbon nanotubes. For example, both the material of the first electrode 24 and the material of the second electrode 25 include palladium (Pd). The work function of palladium is 5.1 eV. The Fermi level of the carbon nanotubes is 4.5 eV, and the energy gap of single-walled carbon nanotubes with a diameter of 1.5 nm is about 0.6 eV. Therefore, the bottom of valence band of the carbon nanotubes is about 4.8 eV (absolute value). That is, the Fermi level of palladium is close to and slightly lower than the bottom of valence band of the carbon nanotubes. This helps the direct injection of the holes in the first electrode 24 into the valence band of the carbon nanotubes under the action of the electric field, thereby forming a better p-type ohmic contact.

For example, both the first electrode 24 and the second electrode 25 include a laminated structure (Ti/Pd) of titanium (Ti) and palladium (Pd), titanium has a thickness of, for example, 0.1 nm to 0.8 nm, and is located between the palladium and the carbon nanotubes. Palladium has a thickness of, for example, 10 nm to 100 nm. Because of the good adhesion between the titanium and the carbon nanotubes, a thin layer of titanium deposited between the palladium and the carbon nanotubes is helpful to improve the adhesion between the electrode and the carbon nanotubes. Because the thickness of the titanium is low, and the titanium does not completely cover the surface of the carbon nanotubes, for example, the titanium are particles that are dispersedly adhered to the surface of carbon nanotubes, palladium is allowed to be in direct contact with the carbon nanotubes to form a good ohmic contact. For example, the first electrode 24 or the second electrode 25 also includes a laminated structure of titanium, palladium and nickel (Ti/Pd/Ni), a thickness of nickel is close to (in a same order of magnitude with) a thickness of palladium, for example, the thicknesses of titanium, palladium and nickel are 0.3 nm, 40 nm and 30 nm, respectively. Because palladium is expensive, the above arrangement can appropriately reduce the cost without affecting the ohmic contact between the electrode and the carbon nanotubes.

In other examples, as shown in FIG. 3B, the first electrode region 231 and the second electrode region 232 in contact with the first electrode 24 and the second electrode 25 respectively, may also be doped to reduce the contact resistance between the electrode and the active layer, that is, both the first electrode 24 and the second electrode 25 are second doped regions. For example, due to the manufacturing processes or materials and so on, Schottky barrier is formed at a contact interface between the carbon nanotubes and the first electrode 24 and a contact interface between the carbon nanotubes and the second electrode 25, which results in a large contact resistance. The Schottky barrier can be reduced by doping the first electrode region 231 and the second electrode region 232 of the active layer.

Taking the doping of carbon nanotubes with OA as an example, e.g., the carbon ring composed of six carbon atoms (similar to benzene ring) in the carbon nanotubes is represented by α, and a reaction between OA and the carbon nanotubes can be expressed as follows:

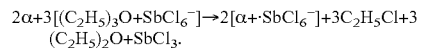

$$2\alpha+3[(C_2H_5)_3O+SbCl_6^-] \rightarrow 2[\alpha \cdot SbCl_6^-]+3C_2H_5Cl+3(C_2H_5)_2O+SbCl_3.$$

Of those, $SbCl_6^-$ is easy to adhere to the surface of metal (for example, the first electrode 24 and the second electrode 25), so that the surface of the metal is negatively charged, which leads to an increase in the work function of the metal, thereby reducing the Schottky barrier between the metal and the carbon nanotubes, and reducing the contact resistance.

For example, the doping concentration of the second doped region is higher than the doping concentration of the first doped region, that is, both the doping concentration of the first electrode region 231 and the doping concentration of the second electrode region 232 are higher than the doping concentration of the second channel region 234.

At least one embodiment of the present disclosure further provides an electronic device, and the electronic device comprises any one of the thin film transistors described above. For example, the electronic device is a display device or an image acquisition device and so on, and the display device is a liquid crystal display device, an organic light-emitting diode display device, or an electronic paper display device. For example, the display device is applied to any products or components with a display function such as mobile phones, tablet computers, televisions, monitors, notebook computers, digital photo frames, and navigators and so on. For example, a pixel circuit in a pixel region of the display device or a drive circuit in a peripheral region of the display device includes the thin film transistor 20.

Figure 5:
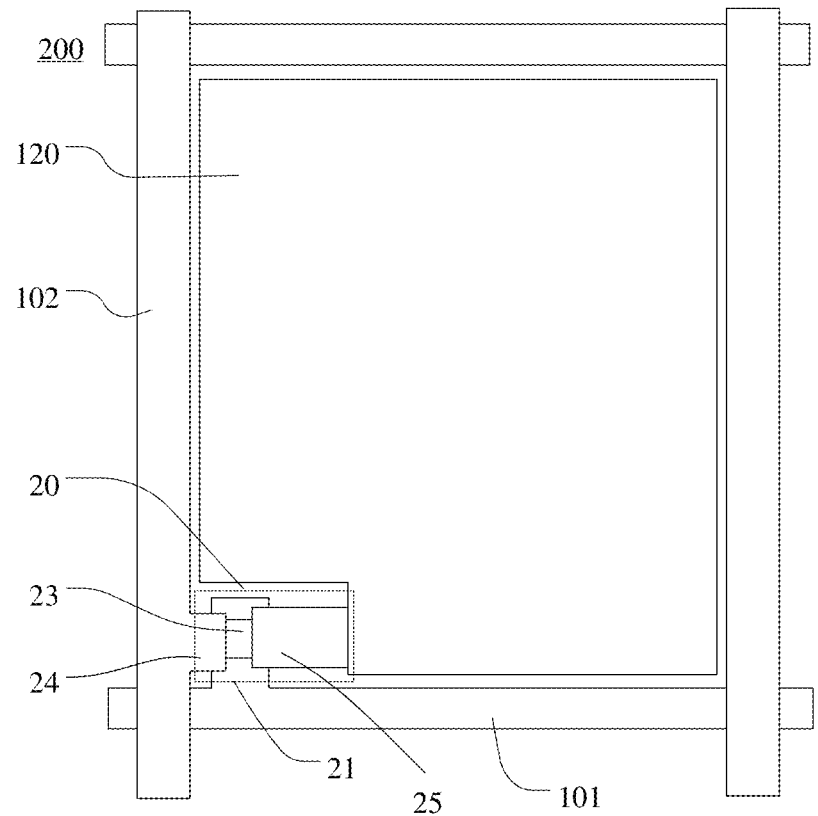
FIG. 5 is a schematic diagram of an electronic device provided in some embodiments of the present disclosure.

FIG. 5 shows a schematic diagram of an electronic device 200 provided in at least one embodiment of the present disclosure. For example, the electronic device is a liquid crystal display device. The liquid crystal display device includes a plurality of gate lines 101 and a plurality of data lines 102. The gate lines 101 and the data lines 102 cross each other to define a plurality of pixels arranged in an array (only one pixel is specifically shown in FIG. 5). Each of the pixels includes a thin film transistor 20 and a pixel electrode 120 for controlling the arrangement of liquid crystal. As a switching element, the thin film transistor 20 controls the signal transmission between the data line 102 and the pixel electrode 120.

The gate electrode of the thin film transistor 20 is electrically connected with the gate line 101, and one of the first electrode 24 and the second electrode 25 is electrically connected with the data line 102, and the other of the first electrode 24 and the second electrode 25 is electrically connected with the pixel electrode 120. For example, the first electrode 24 of the thin film transistor 20 is a source electrode, and the second electrode 25 of the thin film transistor 20 is a drain electrode. For example, as shown in FIG. 5, the first electrode 24 of the thin film transistor 10 is electrically connected with the data line 102, and the second electrode 25 is electrically connected with the pixel electrode 120.

In the case where the gate line 101 receives a scanning signal, a row of thin film transistors 20 correspondingly connected with the gate line 101 are turned on. Data on the data line 102 is written into the pixel electrode 120 through the thin film transistor 20 correspondingly connected with the data line. Liquid crystal molecules are deflected by the electric field between the pixel electrode 120 and the common electrode (not shown) to perform the display operation.

In the embodiment as shown in FIG. 5, the thin film transistor 20 has a bottom gate structure, and the gate electrode 21 is symmetrically arranged with respect to the first electrode and the second electrode. However, the embodiments of the present disclosure are not limited to this, and the gate electrode 21 of the thin film transistor 20 may also be asymmetric with respect to the first electrode and the second electrode. For details, the description of the thin film transistor 20 can be referred to the previous description of the thin film transistor 20, which will not be repeated herein.

At least one embodiment of the present disclosure further provides a manufacturing method of any one of the aforesaid thin film transistors. The manufacturing method at least includes: forming an active layer, a first electrode, a second electrode, a gate insulation layer, and a gate electrode on a base substrate, the forming the active layer includes: forming a one-dimensional semiconductor nano material layer, in which the one-dimensional semiconductor nano material layer includes a first electrode region, a second electrode region, a first channel region, and a first region to be doped, the first electrode and the second electrode are in contact with the first electrode region and the second electrode region respectively, the first channel region is directly connected with both the first electrode region and the first region to be doped, and the first region to be doped is located between the first channel region and the second electrode region; and doping the first region to be doped to form a second channel region, in which an energy level of the second channel region is different from an energy level of the first channel region corresponding to the energy level of the second channel region.

FIG. 6A to FIG. 6F are flow diagrams of a manufacturing method of a thin film transistor provided in an embodiment of the present disclosure. The manufacturing method of the thin film transistor provided in the embodiment will be exemplarily explained with reference to FIG. 1A to FIG. 1B and FIG. 6A to FIG. 6F. The manufacturing method includes, for example, the following step S61 to step S65.

Figure 6A:
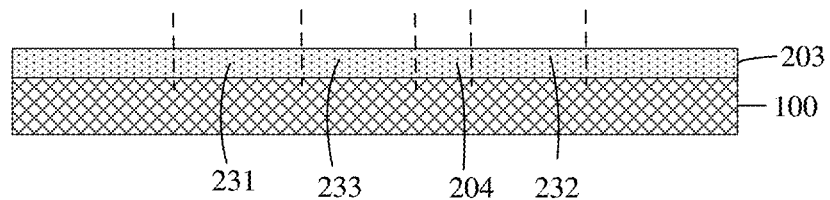
FIG. 6A to FIG. 6F are flow diagrams of a manufacturing method of the thin film transistors provided in some embodiments of the present disclosure.

Step S61: as shown in FIG. 6A, a one-dimensional semiconductor nano material layer 203 is formed on the base substrate 100, the one-dimensional semiconductor nanomaterial layer 203 includes a first electrode region 231, a second electrode region 232, a first channel region 233, and a first region to be doped 204. The first channel region 233 is directly connected with both the first electrode region 231 and the first to-be-doped region 204, and the first region to be doped 204 is located between the first channel region 233 and the second electrode region 232.

For example, the material of the one-dimensional semiconductor nano material layer 203 is a carbon nanotube material, a nanowire material and so on, for example, a single-walled carbon nanotube material.

For example, take the one-dimensional semiconductor nano material layer made of the single-walled carbon nanotube material as an example. The manufacturing method includes forming single-walled carbon nanotube powder by an arc method (or a thermal plasma method, a laser ablation method). Then, the single-walled carbon nanotube powder is mixed with an organic solution (for example, a toluene solution containing polymer), dispersed, centrifuged, filtered, and redispersed to give a solution of semiconductor single-walled carbon nanotubes. Then, a single-walled carbon nanotube layer is deposited on the base substrate 100 by a Czochralski method.

The carbon nanotube material adopted in the embodiments of the present disclosure is a carbon nanotube material with semiconductor characteristics and having a chiral index (n, m) satisfying that (n−m)/3 is a non-integer. However, the embodiments of the present disclosure are not limited to specific chiral carbon nanotubes.

For example, the base substrate 100 includes a silicon substrate, and in order to prevent the silicon substrate from affecting the characteristics of the device, a silicon oxide film may be further formed on the silicon substrate. For example, the base substrate 100 is also a glass substrate or a flexible substrate, and the material of the flexible substrate can be, e.g., polyimide (PI), polycarbonate (PC), polyethylene glycol terephthalate (PET), polyethylene (PE), polypropylene (PP), polysulfone (PSF), polymethylmethacrylate (PMMA), cellulose triacetate (TAC), cycloolefin polymer (COP), and cycloolefin copolymer (COC) and so on.

Figure 6B:
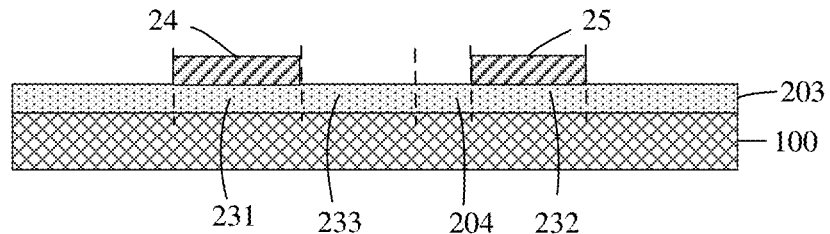

Step S62: as shown in FIG. 6B, a first electrode 24 and a second electrode 25 are formed on the one-dimensional semiconductor nano material layer 203. The first electrode 24 is formed on the first electrode region 231 of the one-dimensional semiconductor nano material layer 203 and the second electrode 25 is formed on the second electrode region 232 of the one-dimensional semiconductor nano material layer 203. For example, as shown in FIG. 6B, in a direction perpendicular to the base substrate 100, the first electrode 24 overlaps with the first electrode region 231, and the second electrode 25 overlaps with the second electrode region 232.

For example, a first conductive layer is formed on the one-dimensional semiconductor nano material layer 203, and the first conductive layer is patterned to form the first electrode 24 and the second electrode 25. For example, the patterning process performed on the first conductive layer is performed by using a patterning process of photoresist combined with an etching process or a lift-off process. For example, a first photoresist is first formed on the one-dimensional semiconductor nano material layer 203, and the first photoresist is exposed (for example, by electron beam exposure technology) and developed to form a first photoresist pattern exposing the first electrode region 231 and the second electrode region 232, and then a first conductive layer is formed on the first photoresist pattern, and a lift-off process is adopted to remove the first photoresist pattern and the conductive layer on the first photoresist pattern, thereby forming the first electrode 24 and the second electrode 25 spaced apart from each other as shown in FIG. 6B.

For example, a distance between the first electrode 24 and the second electrode 25 is 50 nm to 50 μm, so as to define a channel length of the thin film transistor. For example, a width (in a direction perpendicular to the channel length) of the first electrode 24 and a width (in a direction perpendicular to the channel length) of the second electrode 25 are 50 nm to 100 µm, so as to define a channel width of the thin film transistor.

For example, a material of the first conductive layer is metal or metal alloy, such as palladium, scandium, chromium, nickel, gold, copper and so on. For example, the Fermi level of the metal material is close to the bottom of conduction band or the top of valence band of the one-dimensional semiconductor nano material layer 203 with a difference of, e.g., not more than 0.3 eV. For example, for the n-type thin film transistor, the Fermi level of the metal is close to the bottom of conductive band of the carbon nanotubes, which is conducive to the smooth injection of electrons in the metal into the one-dimensional semiconductor nano material. For example, for the p-type thin film transistors, the Fermi level of the metal is close to the top of valence band of the carbon nanotubes, which is conducive to the smooth injection of holes in the metal into the one-dimensional semiconductor nano material.

For example, the first electrode 24 and the second electrode 25 include a laminated structure (Ti/Pd) of titanium (Ti) and palladium (Pd), titanium has a thickness of, for example, 0.1 nm to 0.8 nm, and is located between the palladium and the carbon nanotubes. Palladium has a thickness of, for example, 10 nm to 100 nm.

For example, the first conductive layer is formed on the one-dimensional semiconductor nano material layer 203 by a vapor deposition process to reduce the contact resistance.

Figure 6C:
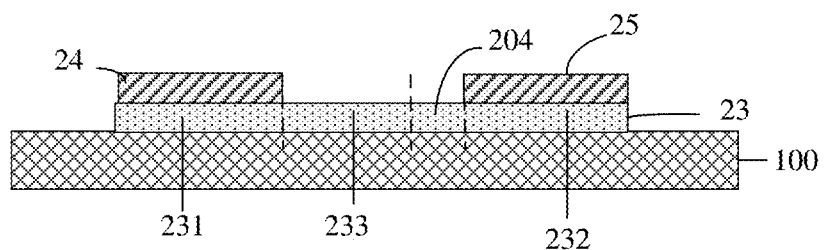

For example, as shown in FIG. 6C, a portion of the one-dimensional semiconductor nano material layer 203 extending beyond the first electrode 24 and the second electrode 205 can be removed, that is, to allow the region of the one-dimensional semiconductor nano material layer 203 which does not overlaps with the first electrode 24 and the second electrode 25 (in the direction perpendicular to the base substrate) only exist between the first electrode 24 and the second electrode 25. Thus, an active layer region only including the first electrode region 231, the second electrode region 232, the first channel region 233, and the first region to be doped 204 is defined. This helps to further reduce the leakage current. For example, a reactive ion etching process is used to remove the above-mentioned portion(s) of the one-dimensional semiconductor nano material layer 203.

Figure 6D:
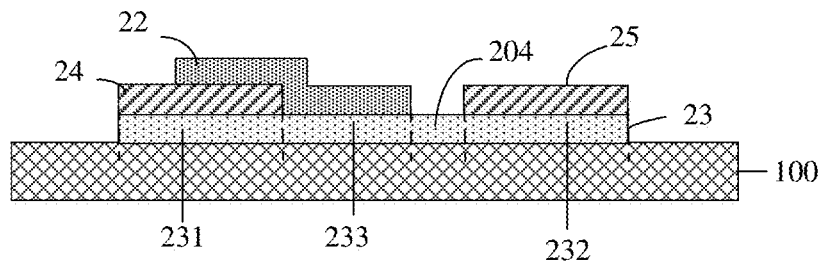

Step S63: as shown in FIG. 6D, a gate insulation layer 22 is formed on the first conductive layer, the gate insulation layer 22 is spaced apart from the second electrode 25, and the first region to be doped 204 is exposed.

The first insulation layer is formed on the first conductive layer, and a second patterning process is performed on the first insulation layer to form the gate insulation layer. For example, a second photoresist is first formed on the first conductive layer, and the second photoresist is exposed (for example, by the electron beam exposure technology) and developed to form a second photoresist pattern exposing at least a portion of the first electrode and the first channel region 233. Then, the first conductive layer is formed on the first photoresist, and a lift-off process is adopted to remove the second photoresist pattern and the insulation layer on the second photoresist pattern, thereby forming a gate insulation layer 22 as shown in FIG. 6C. For example, a distance between an opening region on the second photoresist pattern and the second electrode 25 is ¹⁄₁₀ of the channel length to ⅓ of the channel length, thereby defining the length of the first region to be doped 204. For example, the channel length is 3000 nm, and the length of the first region to be doped 204 is 600 nm.

For example, the material of the first insulation layer is silicon nitride or silicon oxide, and may also be a metal oxide insulation material, such as hafnium oxide ($HfO_2$). For example, the first insulation layer is formed by a chemical vapor deposition method, an atomic layer deposition (ALD) method and so on. For example, a thickness of the first insulation layer is 10 nm to 50 nm.

In an example, an atomic layer deposition process is used to form a hafnium oxide film with a thickness of 10 nm as the first insulation layer at 90° C.

Figure 6E:
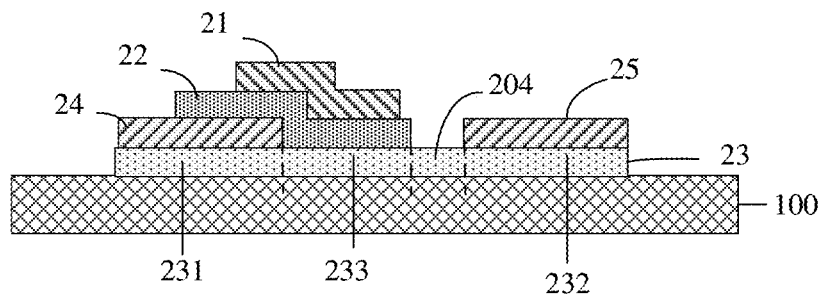

S64: as shown in FIG. 6E, a gate electrode 21 is formed on the gate insulation layer 22. In the direction perpendicular to the base substrate 100, the gate electrode 21 overlaps with the first electrode 24, a gap exists between the gate electrode 21 and the second electrode 25, and the gap exposes the first region to be doped 204. That is, an orthographic projection of the gate electrode 21 on the base substrate 100 overlaps with an orthographic projection of the first electrode 24 on the base substrate 100, and a gap exists between the orthographic projection of the gate electrode 21 on the base substrate 100 and the orthographic projection of the second electrode 25 on the base substrate 100.

A second conductive layer is formed on the gate insulation layer 22, and a third patterning process is performed on the second conductive layer to form the gate electrode 21. For example, the third patterning process includes the above etching process or the above lift-off process, which will not be described in details herein.

For example, a material of the second conductive layer is metal or metal alloy, such as, palladium, scandium, chromium, nickel, gold, copper and so on.

For example, the second conductive layer is formed by an evaporation process, a sputtering process and other processes. For example, a thickness of the second conductive layer is 50 nm to 200 nm.

In an example, the second conductive layer includes a laminated structure of palladium and nickel, and the thicknesses of the palladium layer and the nickel layer are 20 nm and 80 nm, respectively, and the palladium layer is closer to the gate insulation layer 22.

Step S65: doping the first region to be doped 204 to form a second channel region 234.

Figure 6F:
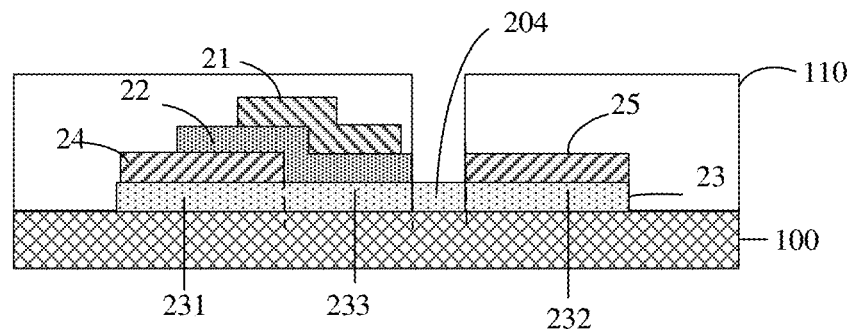

For example, as shown in FIG. 6F, a second insulation material layer is formed on the base substrate 100, a fourth patterning process is performed on the second insulation material layer to form a protective layer 110, and the protective layer 110 covers the structure formed on the base substrate 100 and exposes the first region to be doped 204. The protective layer can protect the structures from corrosion by the doping materials. For example, the material of the protective layer 110 is an organic insulation material, such as polymethylmethacrylate (PMMA), and a thickness of the protective layer is 100 nm to 500 nm, such as 200 nm.

The following takes the material of the one-dimensional semiconductor nano material layer including the carbon nanotubes as an example. The doping of the first doped region 204 is exemplified by taking p-type doping of the carbon nanotube as an example.

Because the band gap of carbon nanotubes is small, it is difficult to adopt atomic substitution doping of traditional semiconductors. In the embodiments of the present disclosure, molecular adsorption is adopted, so that the dopant is in direct contact with the surface of the carbon nanotubes and the charge transfer is occurred, thereby performing the doping of the carbon nanotubes.

For example, the doping process includes preparing a doping solution, for example, dissolving triethyloxonium hexachloroantimonate (OA) molecules in an organic solvent to form an OA solution, for example, the organic solvent is isopropanol. For example, a mass of the OA molecules is 60 mg and a mass of isopropanol is 6 ml.

Then, the transistor structure having the protective layer 110 formed thereon is soaked in the OA solution to dope the first region to be doped 204. The doping concentration of the first region to be doped 204 can be adjusted by adjusting the concentration of the OA molecules in the OA solution and the soaking conditions (such as the solution temperature and the soaking time and so on.). For example, in this embodiment, the transistor structure having the protective layer 110 formed thereon is soaked in the OA solution at 40° C., and stands for 20 hours. Because the first region to be doped 204 is exposed to air, the first region to be doped 204 is in direct contact with the OA solution. The OA molecules which have certain oxidizability can be adsorbed onto the surface of the carbon nanotubes so that charge transfer occurs between the OA molecules and the carbon nanotubes, thereby resulting in the stably positively charged carbon nanotubes, and performing the p-type doping.

Then, the residual dopant on the transistor structure is cleaned and the protective layer 110 is removed. For example, isopropyl alcohol is used to remove the residual OA molecules, and acetone is used to remove the protective layer 110. Thus, the thin film transistor 20 shown in FIG. 1A to FIG. 1B is obtained.

Figure 7:
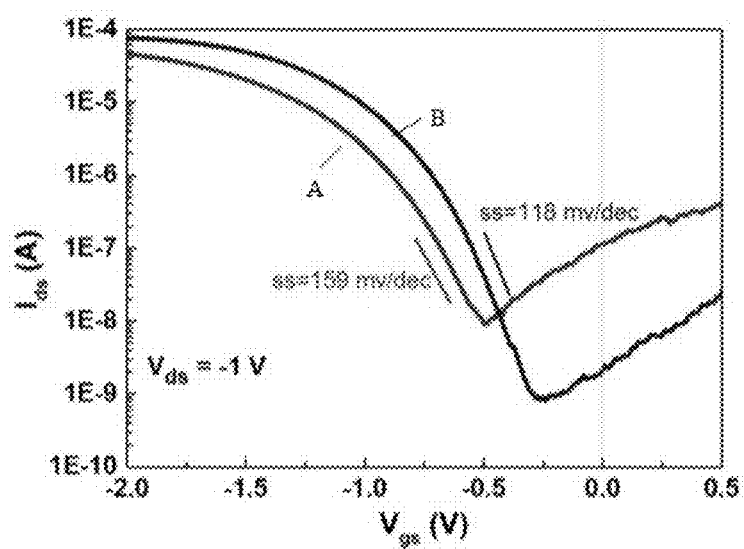
FIG. 7 shows a transfer characteristic curve of a thin film transistor before and after doping the second channel region.

FIG. 7 shows the transfer characteristic curves of the thin film transistor in the case where the second channel region 234 is un-doped and in the case where the second channel region 234 is doped with the OA solution. The curve A corresponds to a case that the second channel region 234 is un-doped, and the curve B corresponds to a case that the second channel region 234 is doped.

As shown in FIG. 7, compared with the thin film transistor with un-doped second channel region, the thin film transistor with doped second channel region provided in the embodiment of the present disclosure has higher turn-on state current and lower turn-off state current under the condition that Vds is −0.1 V. Of those, the turn-off state current drops below the nanoampere level, and the switching ratio of the current increases by 102 times, reaching 105. A subthreshold swing (SS) is reduced from 159 mv/dec to 118 mv/dec, and the threshold voltage of the device is closer to 0 V.

In the manufacturing method of the thin film transistor of the above example, an asymmetric gate electrode with respect to the first electrode and the second electrode is formed to achieve the doping of the second channel region 234. In other embodiments, symmetrical gate structures can also be formed. For example, as shown in FIG. 3A, the gate electrode 21 overlaps with both the first electrode 24 and the second electrode 25 in the direction perpendicular to the base substrate 100, that is, the orthographic projection of the gate electrode 21 on the base substrate 100 overlaps with both the orthographic projection of the first electrode 24 on the base substrate 100 and the orthographic projection of the second electrode 25 on the base substrate 100. In this case, for example, the first region to be doped 204 is doped before forming the gate electrode. For example, the doping is performed after forming the one-dimensional semiconductor nano material layer 203 and before forming the first electrode and the second electrode, or after forming the first electrode and the second electrode and before forming the gate insulation layer.

In other examples, a thin film transistor with a bottom gate structure or thin film transistors with other structures may also be formed, which will not be described in details herein.

The above are merely specific implementations of the present disclosure without limiting the protection scope of the present disclosure thereto. The protection scope of the present disclosure should be based on the protection scope of the appended claims.

What is claimed is:

1. A thin film transistor, comprising:
   a base substrate, and
   a gate electrode, a gate insulation layer, an active layer, a first electrode, and a second electrode which are arranged on the base substrate,
   wherein a material of the active layer is a one-dimensional semiconductor nano material, and the active layer comprises a first electrode region, a second electrode region, a first channel region, and a second channel region;
   the first electrode region and the second electrode region are in contact with the first electrode and the second electrode respectively, the first channel region is directly connected with the first electrode region and the second channel region respectively, and the second channel region is located between the first channel region and the second electrode region; and
   the second channel region is a first doped region, and an energy level of the second channel region is different from an energy level of the first channel region corresponding to the energy level of the second channel region,
   wherein a doping concentration of the second channel region is higher than a doping concentration of the first channel reign.

2. The thin film transistor according to claim 1, wherein the material of the active layer comprises a carbon nanotube material or a nanowire material.

3. The thin film transistor according to claim 1, wherein the thin film transistor is a p-type thin film transistor, and the energy level of the second channel region is higher than the energy level of the first channel region corresponding to the energy level of the second channel region; or
   the thin film transistor is an n-type thin film transistor, and the energy level of the second channel region is lower than the energy level of the first channel region corresponding to the energy level of the second channel region.

4. The thin film transistor according to claim 3, wherein the thin film transistor is the p-type thin film transistor, a material of the first channel region is carbon nanotube, and a material of the second channel region is p-type carbon nanotube material obtained by doping the carbon nanotube with triethyloxonium hexachioroantimonate (OA) or yttrium oxide.

5. The thin film transistor according to claim 1, wherein the gate electrode is farther away from the base substrate than the active layer; and
   a gap exists between the gate electrode and the second electrode, and in a direction perpendicular to the base substrate, the gap exposes the second channel region of the active layer.

6. The thin film transistor according to claim 1, wherein in a direction perpendicular to the base substrate, the gate electrode overlaps with the first channel region and does not overlap with the second channel region.

7. The thin film transistor according to claim 1, wherein in a direction perpendicular to the base substrate, the gate electrode overlaps with the first electrode and does not overlap with the second electrode.

8. The thin film transistor according to claim 1, wherein in a direction perpendicular to the base substrate, the gate insulation layer overlaps with the first channel region and does not overlap with the second channel region.

9. The thin film transistor according to claim 1, wherein in a direction perpendicular to the base substrate, the gate electrode overlaps with both the first channel region and the second channel region.

10. The thin film transistor according to claim 1, wherein the first electrode region and the second electrode region are second doped regions respectively, and both a doping concentration of the first electrode region and a doping concentration of the second electrode region are higher than the doping concentration of the second channel region.

11. The thin film transistor according to claim 1, wherein the first electrode and the second electrode are a source electrode of the thin film transistor and a drain electrode of the thin film transistor, respectively.

12. An electronic device, comprising the thin film transistor according to claim 1.

13. A manufacturing method of a thin film transistor, comprising:
    forming an active layer, a first electrode, a second electrode, a gate insulation layer, and a gate electrode on a base substrate,
    wherein a material of the active layer is a one-dimensional semiconductor nano material, and forming the active layer comprises:
    forming a one-dimensional semiconductor nano material layer, the one-dimensional semiconductor nano material layer comprises a first electrode region, a second electrode region, a first channel region, and a first region to be doped, the first electrode and the second electrode are in contact with the first electrode region and the second electrode region respectively, the first channel region is directly connected with both the first electrode region and the first region to be doped, and the first region to be doped is located between the first channel region and the second electrode region; and
    doping the first region to be doped to form a second channel region, wherein an energy level of the second channel region is different from an energy level of the first channel region corresponding to the energy level of the second channel region,
    wherein the active layer comprises the first electrotrode region, the second electrode region, the first channel region, and the second channel region;
    the first channel region is directly connected with the first electrode region and the second channel region respectively, and the second channel region is located between the first channel region and the second electrode region; and
    wherein a doping concentration of the second channel region is higher than a doping concentration of the first channel region.

14. The manufacturing method according to claim 13, wherein the material of the active layer comprises a carbon nanotube material or a nanowire material.

15. The manufacturing method according to claim 14, wherein the forming the active layer, the first electrode, the second electrode, the gate insulation layer, and the gate electrode on the base substrate comprises:
    forming the active layer on the base substrate,
    forming the gate insulation layer on the active layer,
    forming the gate electrode on the gate insulation layer, wherein in a direction perpendicular to the base substrate, the gate electrode overlaps with the first electrode, and a gap exists between the gate electrode and the second electrode, and the gap exposes the first region to be doped.

16. The manufacturing method according to claim 15, wherein the material of the active layer comprises the carbon nanotube material, and the doping the first region to be doped to form the second channel region comprises:
    after forming the gate electrode, doping the first region to be doped with triethyloxonium hexachloroantimonate (OA).

17. The manufacturing method according to claim 13, further comprising:
    after forming the gate electrode and before doping the first region to be doped, forming a protective layer to cover the thin film transistor, wherein the protective layer exposes the first region to be doped.

18. The manufacturing method according to claim 13, wherein the forming of the active layer further comprises:
    removing a portion of the one-dimensional semiconductor nanomaterial layer extending beyond the first electrode and the second electrode.

* * * * *